United States Patent
Chang

(10) Patent No.: US 7,435,512 B2
(45) Date of Patent: Oct. 14, 2008

(54) PHOTOLITHOGRAPHY PROCESS AND PHOTOMASK STRUCTURE IMPLEMENTED IN A PHOTOLITHOGRAPHY PROCESS

(75) Inventor: Ching-Yu Chang, Yuanshan Township, Yilan County (TW)

(73) Assignee: Macronix International Co., Ltd., Hsinchu (TW)

( * ) Notice: Subject to any disclaimer, the term of this patent is extended or adjusted under 35 U.S.C. 154(b) by 734 days.

(21) Appl. No.: 10/894,924

(22) Filed: Jul. 20, 2004

(65) Prior Publication Data

US 2005/0136338 A1  Jun. 23, 2005

(30) Foreign Application Priority Data

Dec. 17, 2003  (TW) ............... 92135864 A

(51) Int. Cl.
*G03F 1/00* (2006.01)
(52) U.S. Cl. ......................................... 430/5
(58) Field of Classification Search ................ 430/5, 430/394; 716/19–21
See application file for complete search history.

(56) References Cited

U.S. PATENT DOCUMENTS 6,558,853 B1 * 5/2003 Kawamura ............... 430/5
2003/0198872 A1 * 10/2003 Yamazoe et al. .......... 430/5

* cited by examiner

*Primary Examiner*—Stephen Rosasco
(74) *Attorney, Agent, or Firm*—Baker & McKenzie LLP; David I. Roche; Daniel A. Tallitsch

(57) ABSTRACT

In a photolithography process, a photoresist layer is formed on a substrate. A photomask is aligned over the substrate to transfer pattern images defined in the photomask on the substrate. The photomask includes first and second patterns of different light transmission rates, and a dummy pattern surrounding the second pattern having a light transmission rate lower than that of the first pattern. The substrate is exposed to a light radiation through the photomask. The photoresist layer then is developed to form the pattern images. The dummy pattern is dimensionally configured to allow light transmission, but in a substantially amount so that the dummy pattern is not imaged during exposure.

15 Claims, 4 Drawing Sheets

PHOTOLITHOGRAPHY PROCESS AND PHOTOMASK STRUCTURE IMPLEMENTED IN A PHOTOLITHOGRAPHY PROCESS

RELATED APPLICATION

This application claims the priority benefit of Taiwan Patent Application No. 092135864, filed on Dec. 17, 2003.

BACKGROUND OF THE INVENTION

1. Field of the Invention

The invention generally relates to a semiconductor process, and more particularly to a photolithography process and a photomask structure that can improve the dimensional transfer of pattern images from a photomask onto a substrate in the photolithography process.

2. Description of the Related Art

In the manufacture of a semiconductor device, a photolithography process is commonly conducted to transfer or image specific patterns predefined on a photomask to a semiconductor wafer or substrate. For this purpose, a photosensitive material (also called photoresist) is initially formed on the substrate. The photoresist layer can be either a positive photoresist or negative photoresist layer depending on whether an assigned region is to be removed after development. Then, the photoresist layer is exposed through the photomask to specific light radiation, so that the pattern defined on the photomask is imaged on the photoresist layer. The radiation used during exposure can include deep ultraviolet (DUV), X rays, electronic beams, ion beams or the like. After the exposure is completed, the substrate is processed to develop the transferred pattern and thereby form a patterned photoresist layer through which the substrate is etched to form the desired circuit pattern.

Since the circuit patterns become increasingly smaller, a photolithography process of higher precision is required. By reducing the wavelength of the exposure light in the photolithography process, small active devices and transistors can be realized by establishing small critical dimension. The critical dimension of the circuit pattern is defined as the smallest pattern line width.

A photomask conventionally includes one or more circuit patterns. The photomask can be of positive or negative type depending on whether the pattern images formed on the photomask are opaque or not. The negative photomask is usually preferred because light scattering in the negative photomask is in a smaller amount and particles falling in opaque regions are less likely to be developed. When light strikes fine particles, the particles absorb light energy. A part of the light energy is absorbed and becomes an internal energy, while the other part of the light energy emerges out under the form of light scattering. Light scattering is one issue to be solved in optical exposure. During the exposure, the particles contained in the photomask scatter light so that the critical dimension of the photoresist pattern formed on the substrate is biased with from the dimension set in the photomask pattern.

FIG. 1 is a schematic view of a conventional photomask. A conventional photomask 100 can include a first pattern 110 and a second pattern 120 of different sizes and an opening area 130. The opening area 130 is located between the first pattern 110 and the second pattern 120 and surrounds the second pattern 120. In FIG. 1, the first pattern 110 and the second pattern area 120 exemplary include line-shaped patterns and have similar line widths 112, 122 and inter-line pitches 114, 124, but the first pattern 110 occupies an area larger than the second pattern 120. In other words, the first pattern 110 has higher pattern density than that of the second pattern 120, i.e. the light transmission rate is higher through the first pattern 110 than through the second pattern 120.

During the exposure, the photomask 100 is placed on a semiconductor substrate having a photoresist layer thereon, and a light radiation is projected through the photomask 100 onto the substrate. The opening area 130 may cause light scattering around the second pattern area 120 of the photomask 100, which may result in the accumulation of light energy in the underlying photoresist layer.

FIG. 2 is a cross-sectional view of a pattern image obtained by the conventional photolithography process. After development, first and second photoresist pattern images 210, 220 are formed on the semiconductor substrate 10 corresponding to the first and second pattern 110, 120 of the photomask 100 as illustrated in FIG. 1. As shown in FIG. 2, the photoresist pattern image 220 formed on the substrate 10 has dimensions biased from those of the corresponding second pattern 120 set in the photomask 100. Reference numeral 222' indicates the target line width as set in the photomask, while reference numeral 222 indicates the actual line width obtained after development. As shown, the line width 222 of the photoresist pattern image 220 is smaller than the line width 212 of the first photoresist pattern image 210. Since the first and second patterns 110, 120 are dimensionally configured with a same line width in the photomask 100, the pattern image of the second pattern 120 thus has been dimensionally biased in the photolithography process.

Conventionally, the pattern of the photomask having a smaller pattern density is configured beforehand to compensate the critical dimension biases occurring when pattern images of different densities are formed. However, this preliminary compensation becomes difficult to achieve as the critical dimensions of the semiconductor devices are increasingly reduced.

Therefore, a need presently exists for a photolithography process that can prevent the dimensional biases of pattern images formed in a photolithography process.

SUMMARY OF THE INVENTION

The application describes a photolithography process using a photomask that can prevent critical dimension biases of pattern images of different pattern densities. A circuit pattern thereby can be formed without the need of a conventional compensation process.

In one embodiment, the photolithography process includes the following steps. A photoresist layer is formed over a substrate. A photomask is aligned over the substrate, wherein the photomask includes a first pattern, a second pattern and a dummy pattern around the second pattern. The substrate is exposed to a light radiation through the photomask. The photoresist layer then is developed to form images of the first and second patterns in the photoresist layer. The dummy pattern is configured to allow light transmission in a substantially small amount so that the dummy pattern is not imaged while the first and second patterns are transferred on the photoresist layer during exposure.

In one embodiment, the dummy pattern is dimensionally configured to include a pattern density substantially smaller than a pattern density of the first and second patterns. In some embodiments, a line width and an inter-line pitch of the dummy pattern are substantially small so that the dummy pattern is not imaged while the first and second patterns are transferred on the photoresist layer during exposure. In a variant embodiment, the dummy pattern is placed at a distance from the second pattern to prevent image bias of the second pattern.

The foregoing is a summary and shall not be construed to limit the scope of the claims. The operations and structures disclosed herein may be implemented in a number of ways, and such changes and modifications may be made without departing from this invention and its broader aspects. Other aspects, inventive features, and advantages of the invention, as defined solely by the claims, are described in the non-limiting detailed description set forth below.

DETAILED DESCRIPTION OF THE EMBODIMENT(S)

In a photolithography process, a photomask carries patterns of different sizes and shapes to be transferred on a photoresist layer laid on a substrate. Due to optical scattering occurring in the exposure step, the critical size of the pattern images defined in the photoresist layer might experience undesirable biases.

Figure 1:
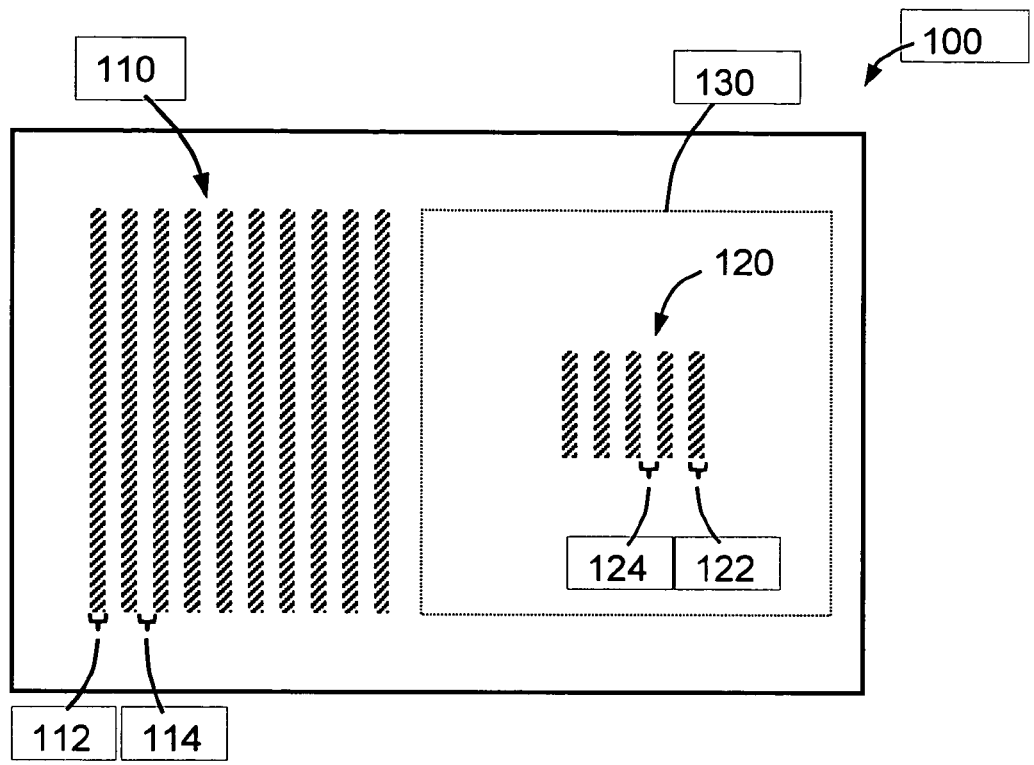
FIG. 1 is a schematic view of a conventional photomask.
Figure 2:
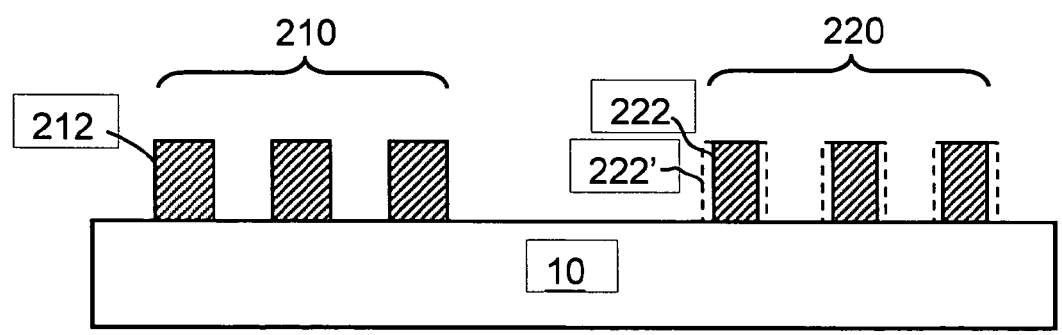
FIG. 2 is a cross-sectional view of pattern images obtained by a conventional photolithography process.
Figure 3:
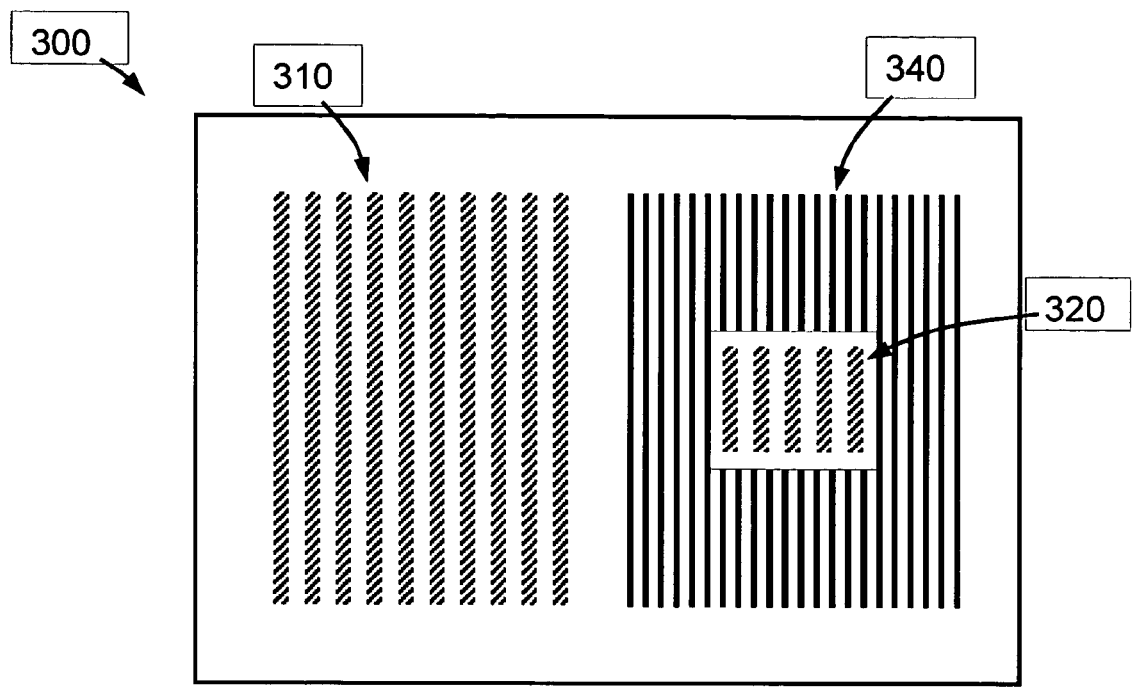
FIG. 3 is a planar view of a photomask according to one embodiment of the invention.

FIG. 3 is a schematic view of a photomask that can alleviate the foregoing problems in a photolithography process according to an embodiment of the invention. The photomask 300 includes at least a first pattern 310, a second pattern 320, and a dummy pattern 340 around the second pattern 320. It is understood that the pattern shown in FIG. 3 is a simplified representation used for purpose of illustration and practically can be embodied in many forms and shapes. For the purpose of clarification, "line width" herein refers to either a transverse dimension of a photoresist pattern image or the corresponding pattern dimension defined in the photomask. "Inter-line pitch" means the distance between two pattern lines.

In the illustrated embodiment, the first and second patterns 310, 320 include linear patterns, and the second pattern 320 occupies an area smaller than the first pattern 310. The linear first pattern 310 includes lines respectively having a line width and an inter-line pitch that are respectively equal to the line width and inter-line pitch of the linear pattern 320. In other words, the first and second patterns 310, 320 have different pattern densities that result in differential light transmission rates in their respective areas, i.e. the light transmission rate is higher through the first pattern 310 than through the second pattern 320.

The photomask 300 can be made of adequate materials such as quartz. According to the design demand, the photomask 300 can be made of a transparent or opaque base material. In an embodiment where the photomask 300 is made of a transparent base material, the first and second patterns 310, 320 are opaque. Conversely, if the photomask 300 is made of an opaque base material, the first, second patterns 310, 320 are transparent. The first and second patterns 310, 320 can exemplary include circuit patterns implemented to form an integrated circuit device.

As shown in FIG. 3, a dummy pattern 340 is formed surrounding the second pattern 320 of lower light transmission rate. The dummy pattern 340 occupies an area larger than the second pattern 320. The dummy pattern 340 can be formed in the shape of straight lines, holes, or the like. In the illustrated embodiment, the dummy pattern 340 includes a plurality of opaque straight lines spaced apart from one another and parallel to the linear second pattern 320.

The dummy pattern 340 is configured to allow light transmission without being transferred during exposure of the photolithography process. In an embodiment, the inter-line pitch and the line width of the linear dummy pattern 340 can be set smaller than those of the second pattern 320. The pattern density of the dummy pattern 340 has a light transmission rate sufficiently low to prevent its transferring during exposure. The dummy pattern 340 is spaced apart from the second pattern at a sufficient distance to prevent a biased image of the second pattern.

Figure 4:
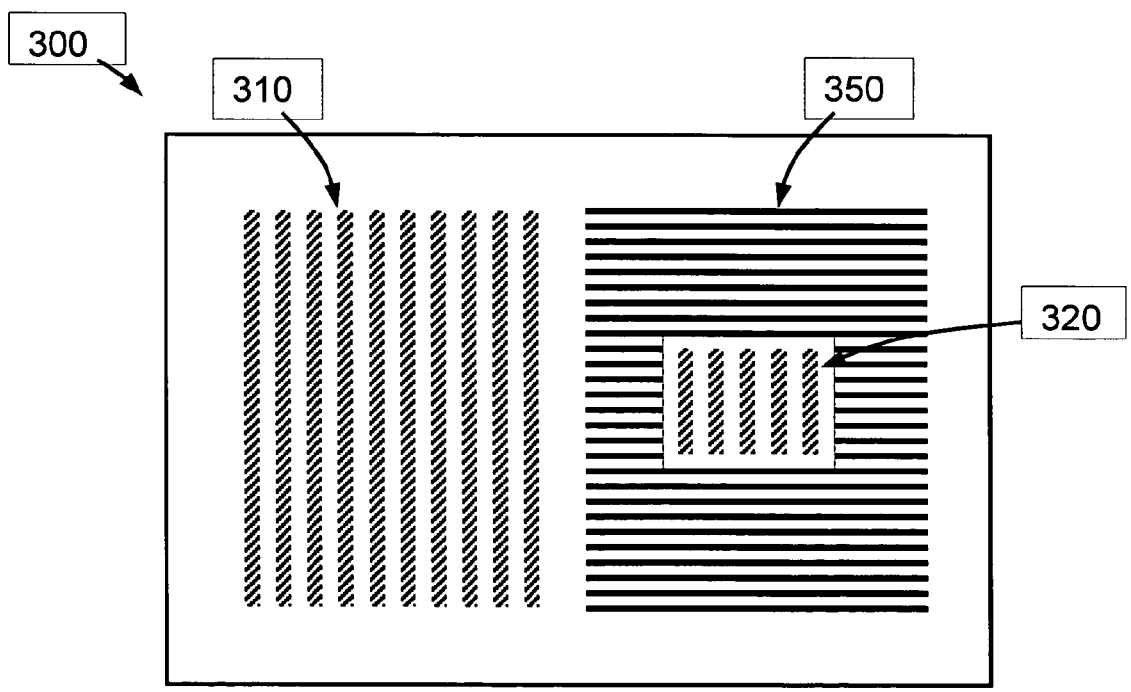
FIG. 4 is a planar view of a photomask according to another embodiment of the invention.

FIG. 4 illustrates a photomask pattern according to a variant embodiment of the invention. The photomask 300 at least includes a first pattern 310, a second pattern 320 and a dummy pattern 350 around the second pattern 320. The first pattern 310 and the second pattern 320 include lines having similar line width and inter-line pitch. The dummy pattern 350 surrounds the second pattern 320 and occupies an area larger than that of the second pattern 320. The dummy pattern 350 includes a plurality of spaced opaque straight lines, but it is understood that diverse shapes of the dummy pattern 350 may be adequate. In the illustrated example, the direction of the linear dummy pattern 350 is approximately orthogonal to that of the linear second pattern 320. The dummy pattern 350 is dimensionally configured to allow light transmission without being imaged during exposure. To this end, the inter-line pitch and the line width of the linear dummy pattern 340 are set smaller than those of the second pattern 320.

Figure 5:
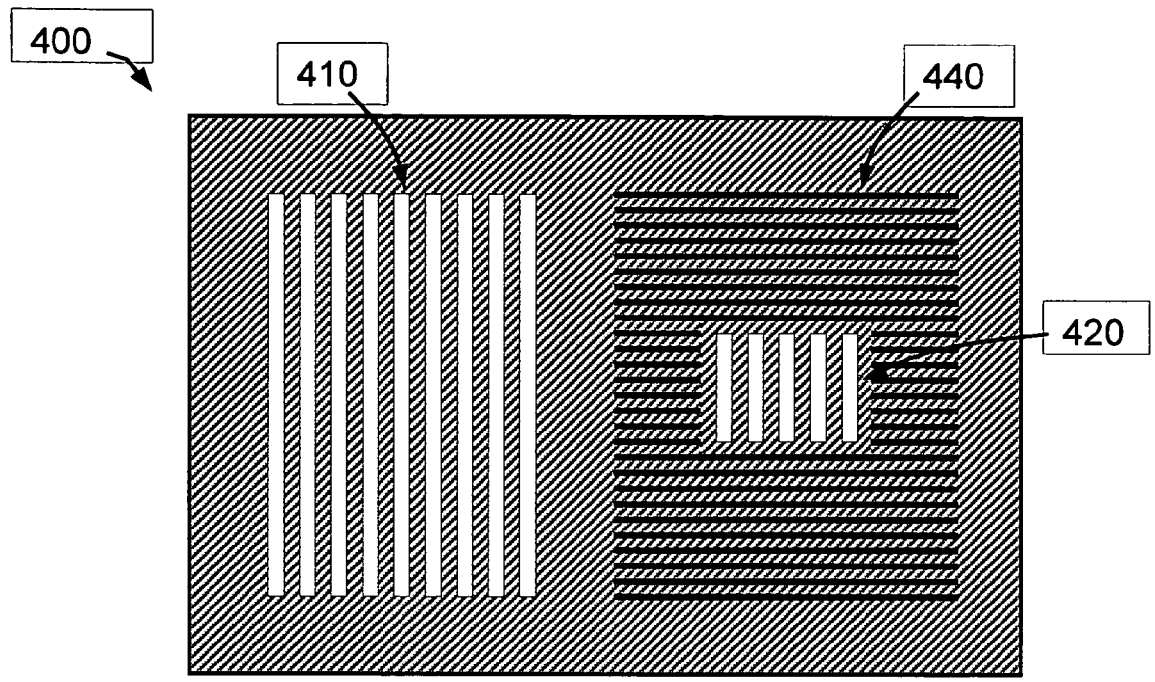
FIG. 5 is a planar view of a photomask according to another variant embodiment of the invention.

FIG. 5 illustrates another variant embodiment of the invention. A photomask 400 is constructed from a base substrate of opaque material and includes a first pattern 410, a second pattern 420 and a dummy pattern 440. The patterns 410, 420, 440 are formed by gap structures such as slits or holes allowing light transmission. The first pattern 410 occupies an area larger than the second pattern 420, but has the same line width and the same inter-line pitch as the second pattern 420, i.e. the first and second patterns 410, 420 have different pattern densities that result in a light transmission rate higher through the first pattern 410 than through the second pattern 420. The dummy pattern 440 surrounds the second pattern 420 and occupies an area larger than that of the second pattern 420. The dummy pattern 440 can include spaced lines. In this embodiment, the direction of the linear dummy pattern 440 is orthogonal to that of the second pattern 420. The line width and the inter-line pitch of the dummy pattern 440 are smaller than those of the second pattern 420 so that the dummy pattern 440 is not transferred during exposure.

Figure 7:
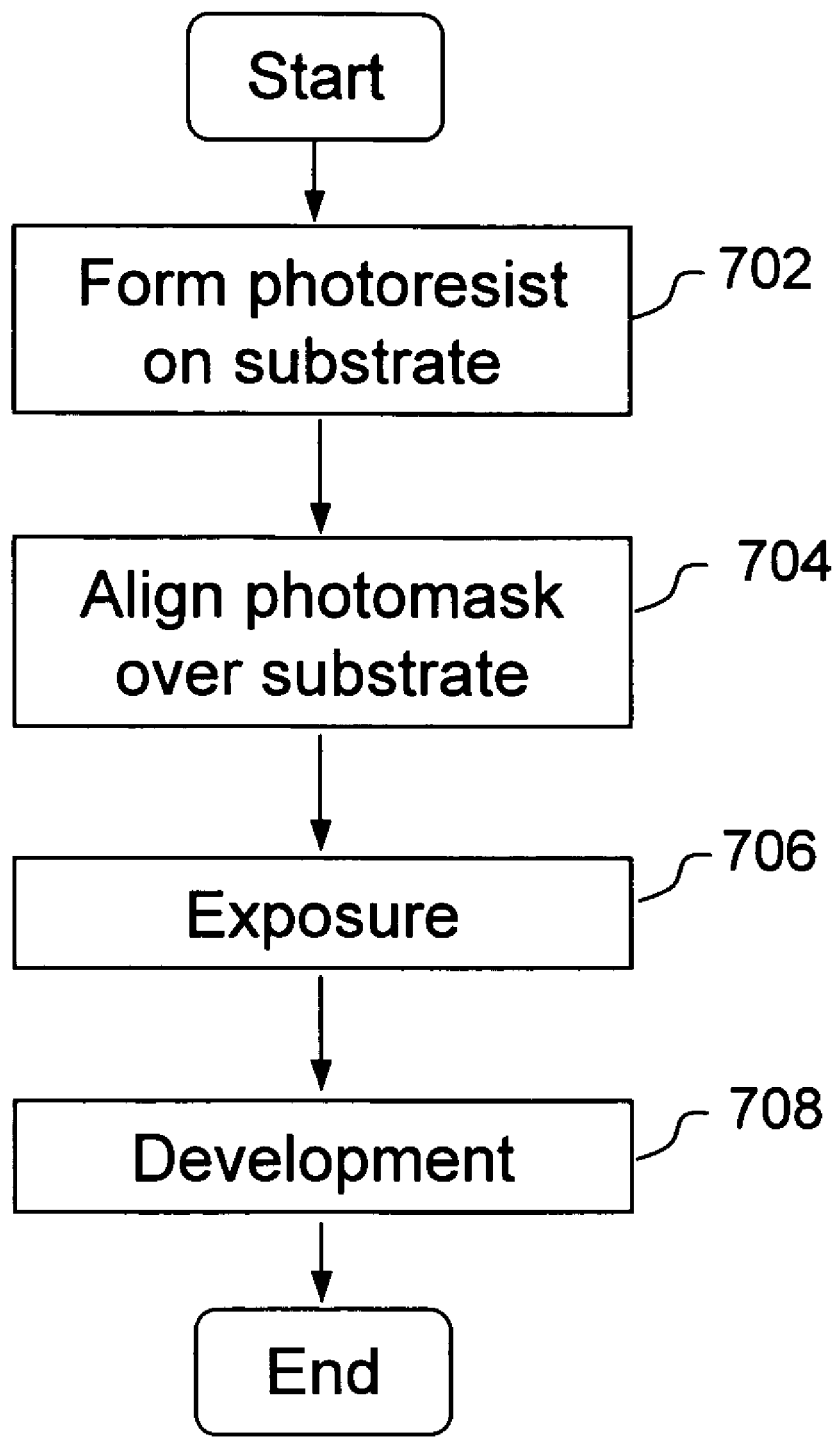
FIG. 7 is a flowchart of a photolithography process implemented according to an embodiment of the invention.

FIG. 7 is a flowchart of a photolithography process implemented according to an embodiment of the invention. Initially, a photoresist layer is formed over a surface of a substrate (702). The photoresist layer can be either a negative or positive photoresist layer formed by spin-coating. A photomask then is aligned over the substrate (704). The photomask includes first and second patterns of different pattern densities to be transferred on the photoresist layer of the substrate, and a dummy pattern surrounding the second pattern of lower pattern density. The configuration of the dummy pattern can be as described in the previous embodiments. An exposure then is performed by irradiating a light beam through the photomask (706). The photoresist layer then is developed to form a photoresist pattern (708).

Figure 6:
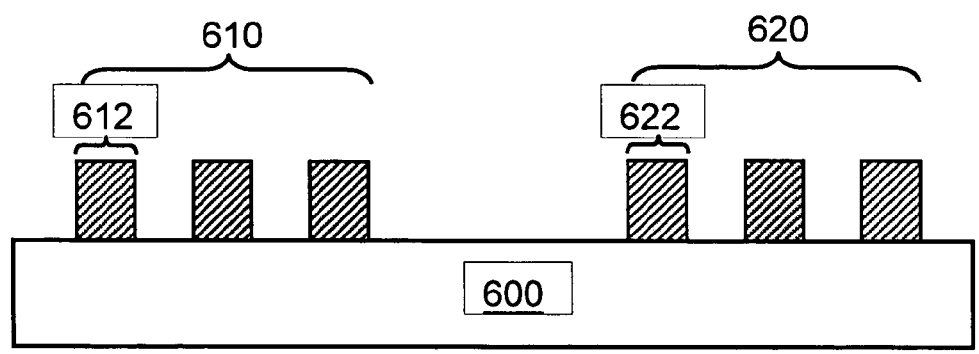
FIG. 6 is a cross-sectional view of a substrate provided with photoresist pattern images obtained by a photolithography process using a photomask according to an embodiment of the invention.

FIG. 6 is a cross-sectional view of photoresist pattern images obtained by a photolithography process using a photomask according to an embodiment of the invention. The substrate 600 includes a first pattern image 610 and a second pattern image 620 both of which are developed into a photoresist layer. By using a photomask configured with a dummy pattern according to the invention, the pattern line width 622 of the pattern image 620 and the pattern line width 612, 622 of the first and second pattern image 610, 620 are similar to the original pattern dimensions set in the photomask. Feature biases between patterns of different densities, i.e. of different light transmission rates, can be thereby advantageously overcome.

As described above, the dummy pattern set in the photomask is configured to allow reduced light transmission at an adjacent area surrounding the second pattern so that the dummy pattern is not transferred during exposure. This reduced light transmission reduces light scattering at the area around the second pattern, which promotes optical accumulation at the areas of the first and second pattern of the photomask. The developed pattern images on the photoresist layer thus can have critical dimensions consistent with the preset dimensions of the photomask patterns, and no compensation process thus is needed. As a result, the manufacture time and manufacture cost can be reduced.

Realizations in accordance with the present invention have been described in the context of particular embodiments. These embodiments are meant to be illustrative and not limiting. Many variations, modifications, additions, and improvements are possible. Accordingly, plural instances may be provided for components described herein as a single instance. Additionally, structures and functionality presented as discrete components in the exemplary configurations may be implemented as a combined structure or component. These and other variations, modifications, additions, and improvements may fall within the scope of the invention as defined in the claims that follow.

What is claimed is:

1. A photolithography process comprising:
providing a substrate;
forming a photoresist layer over the substrate;
aligning a photomask over the substrate, wherein the photomask at least includes a first pattern, a second pattern and a dummy pattern surrounding the second pattern and occupying a larger area than the second pattern, the second pattern having a second light transmission rate different from a first light transmission rate of the first pattern;
exposing the substrate to a light radiation through the photomask, wherein the dummy pattern is configured to allow light transmission in a substantially small amount so that the dummy pattern is not imaged on the photoresist layer; and
developing the photoresist layer.

2. The process of claim 1, wherein the dummy pattern is dimensionally configured to include a pattern density substantially smaller than a pattern density of the first and second patterns so that the first and second patterns are imaged while the dummy pattern is not imaged while exposing the substrate to a light radiation through the photomask.

3. The process of claim 2, wherein the dummy pattern has a line width smaller than a line width of the first and second pattern.

4. The process of claim 1, wherein the dummy pattern includes replicated features.

5. The process of claim 3, wherein the replicated features include hole or linear gap patterns.

6. The process of claim 1, wherein the photoresist layer is a positive photoresist.

7. The process of claim 1, wherein the photoresist layer is negative photoresist.

8. The process of claim 1, wherein the photomask is made of quartz.

9. A photomask suitable for use in a photolithography process, comprising:
a base substrate including:
a first pattern of a first pattern density;
a second pattern of a second pattern density; and
a dummy pattern of a third pattern density surrounding the second pattern and occupying a larger area than the second pattern;
wherein the third pattern density is dimensionally configured to allow light transmission in a substantially small amount so that the dummy pattern is not imaged in an exposure process of the photolithography process.

10. The photomask of claim 9, wherein the third pattern density has a light transmission rate substantially smaller than that of the first and second pattern densities so that the first and second patterns are imaged while the dummy pattern is not imaged during exposure of the photolithography process.

11. The photomask of claim 10, wherein the dummy pattern includes a line width substantially smaller than a line width of the first and second pattern.

12. The photomask of claim 9, wherein the dummy pattern is placed at a distance from the second pattern.

13. The photomask of claim 9, wherein the base substrate of the photomask is made of a transparent material, while the first pattern, the second pattern and the dummy pattern are opaque patterns.

14. The photomask of claim 9, wherein the base substrate of the photomask is made of an opaque material, and the first pattern, the second pattern and the dummy pattern are transparent patterns.

15. The photomask of claim 13, wherein the base substrate is made of a transparent glass.

* * * * *